(12) United States Patent
Karch et al.

(10) Patent No.: US 11,728,573 B2
(45) Date of Patent: Aug. 15, 2023

(54) METHOD FOR PRODUCING A LAYER OF A DEVICE FOR THE ABSORPTION OF ELECTROMAGNETIC RADIATION

(71) Applicant: Airbus Defence and Space GmbH, Taufkirchen (DE)

(72) Inventors: Christian Karch, Taufkirchen (DE); Christian Metzner, Taufkirchen (DE); Matthias Bleckmann, Buch am Erlbach (DE); Heinrich Dinnebier, Landshut (DE)

(73) Assignee: Airbus Defence and Space GmbH

( * ) Notice: Subject to any disclaimer, the term of this patent is extended or adjusted under 35 U.S.C. 154(b) by 641 days.

(21) Appl. No.: 16/697,678

(22) Filed: Nov. 27, 2019

(65) Prior Publication Data
US 2021/0280982 A1 Sep. 9, 2021

(30) Foreign Application Priority Data
Dec. 14, 2018 (DE) ...................... 10 2018 132 217.8

(51) Int. Cl.
*B33Y 10/00* (2015.01)
*B28B 1/00* (2006.01)
(Continued)

(52) U.S. Cl.
CPC .............. *H01Q 17/00* (2013.01); *B28B 1/001* (2013.01); *B33Y 10/00* (2014.12); *B33Y 80/00* (2014.12);
(Continued)

(58) Field of Classification Search
CPC ....... B05B 13/041; B05B 7/0408; B05D 1/12; B05D 2601/20; B05D 5/00; B22F 7/002;
(Continued)

(56) References Cited

U.S. PATENT DOCUMENTS

| 5,693,429 A | 12/1997 | Sengupta et al. |
| 2013/0214181 A1 | 8/2013 | Delpech et al. |
| 2016/0169311 A1 | 6/2016 | Im et al. |

FOREIGN PATENT DOCUMENTS

| JP | 2010161267 A | 7/2010 |
| KR | 101640783 B1 | 7/2016 |

(Continued)

OTHER PUBLICATIONS

Extended European Search Report with Written for Application No. 19203831.3 completed on Mar. 26, 2020, 3 pages (p. 6 categorizing the cited references).
Li Wei et al: "Ceramic-based electromagnetic wave absorbing materials and concepts towards lightweight, flexibility and thermal resistance", International Materials Reviews Bd. 68, Nr. 5, Jun. 6, 2022 (Jun. 6, 2022), Seiten 487-520, XP093055168, US ISSN: 0950-6608, DOI: 10.1080/09506608.2022.2077028. 35 pgs.
(Continued)

*Primary Examiner* — Alexander M Weddle
(74) *Attorney, Agent, or Firm* — Lerner David LLP (57) ABSTRACT

A method for producing a layer of a device for electromagnetic radiation absorption, includes: providing a ply of powder material in the layer to be produced of the device; providing a predefined concentration distribution of particles for electromagnetic radiation absorption in the layer; providing a first binder and a second binder for the powder materials, wherein the first binder includes particles for the absorption of electromagnetic radiation, wherein the second binder includes a lower concentration of identical and/or different particles than the first binder; determining a mixing ratio between the first binder and the second binder for every position in the layer; selecting a position of the layer; mixing the first and second binder according to the mixing ratio for the selected position; wetting the powder material at the selected position using the mixed first and second binders; and repeating selecting, mixing, and wetting to produce the layer.

11 Claims, 5 Drawing Sheets

(51) Int. Cl.
  *H01Q 17/00* (2006.01)
  *B33Y 80/00* (2015.01)
  *B22F 7/00* (2006.01)
  *C04B 35/626* (2006.01)

(52) U.S. Cl.
  CPC .......... *H01Q 17/004* (2013.01); *B22F 7/002* (2013.01); *C04B 35/62635* (2013.01)

(58) Field of Classification Search
  CPC ....... B29C 64/165; B28B 1/001; B33Y 10/00; B33Y 80/00; C04B 2235/6026; C04B 2235/775; C04B 35/62635; C09D 5/30; C09D 5/32; F41H 3/00; H01Q 17/00; H01Q 17/004; H05K 9/0088
  See application file for complete search history.

(56) References Cited

FOREIGN PATENT DOCUMENTS

| | | | |
|---|---|---|---|
| KR | 101664995 B1 | 10/2016 | |
| WO | WO-2016053305 A1 * | 4/2016 | ........... B29C 64/165 |
| WO | WO-2016072966 A1 * | 5/2016 | ........... B29C 64/112 |
| WO | WO-2018189190 A1 * | 10/2018 | ........... B22F 1/0062 |

* cited by examiner

METHOD FOR PRODUCING A LAYER OF A DEVICE FOR THE ABSORPTION OF ELECTROMAGNETIC RADIATION

FIELD OF THE INVENTION

The invention relates to a method for producing a layer of a device for the absorption of electromagnetic radiation. Furthermore, the invention relates to a device for the absorption of electromagnetic radiation and a means of transportation.

BACKGROUND OF THE INVENTION

Radar systems, for example, are used to discover and detect the position of means of transportation, for example, ships or aircraft and spacecraft. The radio waves emitted by the radar system are reflected from the surface of the means of transportation and picked up by the radar system. The presence and the position of the means of transportation can thus be ascertained.

To reduce the reflection of radar waves on the surfaces of the means of transportation, the backscatter coefficient of the surfaces can be reduced by radar-absorbing materials or radar-absorbing structures. In the case of radar-absorbing materials, these materials are arranged and/or integrated on and/or in the external structures of the means of transportation, which are generally produced either from metal alloys or from carbon-fibre composite materials. In the case of radar-absorbing structures, the materials which are used for the outer structures are modified so that they obtain radar-absorbing properties. In this case, for example, layer structures or materials having gradients in the dielectric constant and also the permeability can be used.

Applying material layers made of two molten thermoplastic materials in the form of a grid is known from US 2016/0263823 A1. The two materials have different radar-absorbing properties, so that a gradient in the radar-absorbing properties can be produced by the mixing during the application.

BRIEF SUMMARY OF THE INVENTION

Aspects of the present invention may provide an improved device for the absorption of electromagnetic radiation and an improved method for producing a layer of a device for the absorption of electromagnetic radiation.

According to one aspect of the invention, a method is provided for producing a layer of a device for the absorption of electromagnetic radiation, wherein the method comprises the following steps: providing a ply of powder material in the layer to be produced of the device for the absorption of electromagnetic radiation; providing a predefined concentration distribution of particles for the absorption of electromagnetic radiation in the layer of the device for the absorption of electromagnetic radiation; providing a first binder for the powder material and a second binder for the powder material, wherein the first binder comprises particles for the absorption of electromagnetic radiation, wherein the second binder comprises a lower concentration of identical and/or different particles for the absorption of electromagnetic radiation than the first binder; determining a mixing ratio between the first binder and the second binder for every position in the layer on the basis of the predefined concentration distribution; selecting a position of the layer; mixing the first and second binder according to the mixing ratio for the selected position; wetting the powder material at the selected position using the mixed first and second binder; and repeating the steps of selecting, mixing, and wetting to produce a layer of the device for the absorption of electromagnetic radiation.

A method is provided by an aspect of the invention, using which the absorption of electromagnetic radiation in a material of a layer of a device for the absorption of electromagnetic radiation can be optimized, wherein the concentration of the particles for absorbing the electromagnetic radiation is produced in an optimized and punctiform manner for every position. The individual particles of the powder material are adhesively bonded to one another using the binder mixture made of the first and second binder in this case and thus form a solid body. A predefined particle concentration is produced in the binder mixture by the mixing of the first and second binder, which comprise different particle concentrations of particles for the absorption of electromagnetic radiation. This mixture can be provided in a punctiform manner and having a continuously changing particle concentration. Furthermore, the binder mixture can also comprise solely the first binder or also solely the second binder. The lower limit of the particle concentration of the binder mixture is equal to the particle concentration in the second binder. The upper limit of the particle concentration in the mixture is the particle concentration of the first binder. Because of the individual mixing of the two binders for each selected position at which the powder material is to be adhesively bonded using the binder, a gradient in the dielectric constant and/or the permeability can be produced in every spatial direction inside the device to be produced for the absorption of electromagnetic radiation. Furthermore, electromagnetically active structures for the device for the absorption of electromagnetic radiation can also be produced in a simple manner using the method for producing a layer of the device for the absorption of electromagnetic radiation.

Furthermore, due to the provision of different particles for the absorption of electromagnetic radiation, the distribution of the particles in the binder and accordingly in the structure to be produced of the layer of the device for the absorption of electromagnetic radiation can be optimized. This can be effectuated, for example, by the selection of different particles which repel one another for the absorption of electromagnetic radiation. The particles are automatically homogeneously distributed in the binder and in the binder mixture due to the repulsion forces between the different particles.

Furthermore, a layer for a device for the absorption of electromagnetic radiation is provided by an aspect of the invention, which can comprise structures which effectuate an absorption of electromagnetic radiation. The material parameters can be influenced on the microscale in this case by means of the selection of the particle concentration of the particles for the absorption of electromagnetic radiation. On the mesoscale, the materials can be influenced by the selection of the different particles and by the selection of the powder materials and binders. Influencing on the macroscale can be effectuated by means of structures which are produced by means of the method in the layer for absorbing the electromagnetic radiation.

The method for producing a layer of the device for absorption can be designed in one example as 3D inkjet powder printing.

According to a further example, the second binder does not comprise particles for the absorption of electromagnetic radiation.

The binder mixture can thus comprise a particle concentration of particles for the absorption of electromagnetic radiation between the particle concentration of the first binder and a concentration of zero. In this manner, the entire layer of a device for the absorption of electromagnetic radiation can be produced, even if no particles for the absorption of electromagnetic radiation are provided in parts of the layer. This enhances the flexibility of the method.

Furthermore, the particles for the absorption of electromagnetic radiation can comprise dielectric, magnetic, and/or electrically conductive particles.

The particles embodied in this manner for the absorption of electromagnetic radiation thus have optimized properties for the absorption of electromagnetic radiation.

In a further example, the particles can absorb the electromagnetic radiation in the megahertz, gigahertz, and/or terahertz range alone or in combination with one another.

In the ranges in which the frequencies are in the megahertz, gigahertz, and/or terahertz range of the electromagnetic radiation, a discovery and position determination can be performed by radar systems. Particles which absorb electromagnetic radiation only, i.e., solely, in these ranges facilitate the production of the layer of the device for the absorption of electromagnetic radiation. Furthermore, combined particles can result due to the combination of particles for the absorption of electromagnetic radiation, which effectuate an absorption in other frequency ranges of the electromagnetic radiation. A combination of the particles can be effectuated, for example, by a change of the concentration of the different particles of the second binder. In this manner, a heterogeneous layer can be produced, which absorbs electromagnetic radiation in the same or other frequency ranges in different regions of the layer depending on the topology and structure of the embedded particles.

The powder material can be homogeneous according to one example.

The particles of the powder material are thus all formed identically, so that the produced layer of the device for the absorption of electromagnetic radiation only comprises the binder mixture and the particles of the powder material. A homogeneous base material can thus be provided for the layer of the device for the absorption of electromagnetic radiation.

In another example, the powder material can be a mixture of at least two different powder materials.

In this manner, mixed materials can be produced to possibly implement special structural components or chemical properties in the layer of the device for the absorption of electromagnetic radiation.

Furthermore, the powder material can comprise a ceramic material.

In this manner, ceramic materials can be produced which absorb electromagnetic radiation. Materials can thus be used above all in the high-temperature range which have absorbing properties for electromagnetic radiation, above all in the radar range. In the case of aircraft and spacecraft, in this manner, for example, the nozzle assemblies and/or the outlets of the nozzle assemblies which define a jet direction can be equipped with absorption properties for electromagnetic radiation.

According to a further example, the method can additionally comprise the following step: repeating the method steps after producing a layer to produce at least one further layer of the device for the absorption of electromagnetic radiation on the produced layer.

A gradient of the dielectric constant and/or the permeability can be effectuated in a direction outside a single layer by the combination of multiple layers. In this manner, an optimized multilayer device for the absorption of electromagnetic radiation can be effectively produced.

Furthermore, the method can comprise the following step after the production of all layers of the device for the absorption of electromagnetic radiation: sintering the device for the absorption of electromagnetic radiation.

In this manner, an entire ceramic component can be produced, in which the device for the absorption of electromagnetic radiation is integrated.

The selected positions of the layer can, according to one example, form a structure pattern, which comprises pores.

By means of the structure patterns, absorbing structures for electromagnetic radiation can be produced, which can be radar-absorbing structures according to one example. In combination with the particles for the absorption of electromagnetic radiation deposited in the layers, the absorption capacity of the layer and/or the device for the absorption of electromagnetic radiation can be further optimized.

It can furthermore be provided that the selected positions of the layer form a structure pattern having different density distributions of the powder material in combination with at least the first binder.

Due to the different density distributions of the powder material and accompanying this a different density distribution of the at least one first binder, the layer can obtain a structure which also effectuates optimization of the absorption capacities. The combination of multiple layers can provide a heterogeneous layer material for the device for the absorption of electromagnetic radiation in this case, which comprises a different density distribution in a direction outside a layer.

According to a further example, the ply of powder material in the layer to be produced of the device for the absorption of electromagnetic radiation can comprise a structure pattern.

A later structure in the layer of the device can thus already be predetermined during the application of the ply of powder material. The selected positions are arranged in this example in the structure pattern of the ply of powder material. In this manner, the production of the device for the absorption of electromagnetic radiation can be accelerated, since the removal of excess powder material is facilitated. Furthermore, the accuracy of a structure pattern can be enhanced, since in this case the binder mixture does not establish the boundaries of the structure pattern, but rather the size of the particles of the powder material.

According to a further aspect of the invention, a device for the absorption of electromagnetic radiation is provided, wherein the device is produced according to the method according to the preceding description, wherein the device comprises at least one layer, wherein the layer comprises a material made of the powder material bonded using at least the first binder; and wherein the layer comprises a concentration distribution of particles for the absorption of electromagnetic radiation according to the predefined concentration distribution.

An aspect of the invention thus provides a device for the absorption of electromagnetic radiation which, in contrast to the prior art, comprises very finely resolved particle concentration variations and gradients. On the one hand, in this case the particle concentration can be set for very small regions at the selected positions during the production of a layer by means of the use of the first and the second binder, wherein the regions can be significantly smaller than in the prior art due to the liquid phase of the binders. Furthermore, because of the small regions in which the binder mixture can be applied, very finely resolved structures can also be produced in the material, which are significantly smaller than in the prior art. In this manner, a device is provided which has a significant improvement in the absorption of electromagnetic radiation, wherein the absorption properties can be optimized to specific frequency ranges of the electromagnetic radiation by the particle concentration in combination with the finely resolved material structure of the device.

According to a further aspect of the invention, a means of transportation is provided, wherein the means of transportation comprises: a device for the absorption of electromagnetic radiation according to the preceding description, and an outer skin; wherein the device is arranged on and/or in the outer skin.

The advantages and effects of the means of transportation are similar to the advantages and effects of the above-described device. Reference is therefore made in this regard to the description indicated above.

BRIEF DESCRIPTION OF THE DRAWINGS

The invention is described hereafter on the basis of an exemplary embodiment by means of the appended drawings. In the figures.

DETAILED DESCRIPTION

Figure 1A:
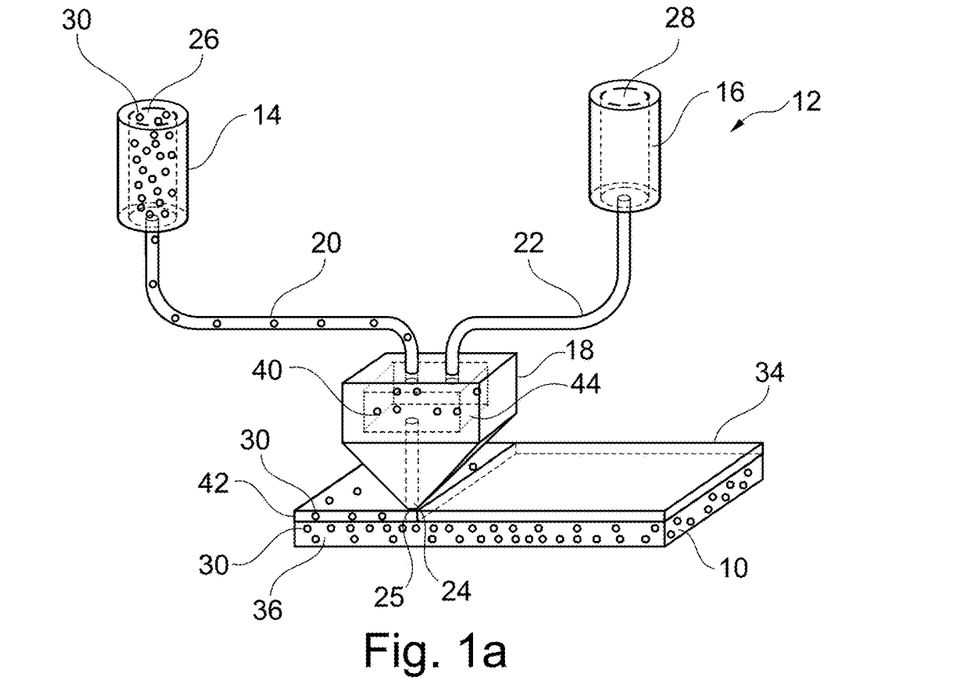
FIGS. 1a, b show schematic illustrations of a 3D printer, which carries out the method for producing a layer of a device for the absorption of electromagnetic radiation.

The device for the absorption of electromagnetic radiation is identified in its entirety by the reference sign 10, as illustrated by way of example in FIG. 1a.

The device 10 comprises at least one layer 42, which comprises a material 36 which was produced from a powder material 34 which was bonded using at least one first binder 26. The first binder 26 comprises in this case particles 30 for the absorption of electromagnetic radiation. The first binder 26 bonds the particles of the powder material 34, so that the material 36 results, which comprises the particles 30 for the absorption of electromagnetic radiation.

The material 36 can furthermore comprise a second binder 28 in this case, which comprises a lower concentration of particles 30 for the absorption of electromagnetic radiation than the first binder 26. The second binder 28 can comprise no particles 30 for the absorption of electromagnetic radiation in this case. In an alternative exemplary embodiment of the second binder 28, the binder 28 can comprise particles 32 for the absorption of electromagnetic radiation, which are different from the particles 30, alternatively or additionally to the particles 30 for the absorption of electromagnetic radiation. The particles 32 different from the particles 30 can have a repulsion property with the particles 30, so that the particles 32 and the particles 30 mutually repel one another. In this manner, a homogeneous distribution of the particles 30 and the particles 32 can take place.

The particles 30 for the absorption of electromagnetic radiation can in this case comprise dielectric, magnetic, and/or electrically conductive particles. Furthermore, the particles 30, alone or in combination with one another, can absorb the electromagnetic radiation in a frequency range which can be arranged in the megahertz, gigahertz, and/or in the terahertz range.

The material 36 can in this case comprise a mixture of the first binder 26 and the second binder 28. Furthermore, the material 36 in combination with the powder material 34 can solely comprise the second binder 28 or can solely comprise the first binder 26.

The device 10 can be produced in this case from multiple layers 42, wherein each layer 42 has a separate concentration distribution for the particles 30 for the absorption of electromagnetic radiation. The concentration of the particles 30 and possibly of the particles 32 in a layer 42 can also be zero in this case.

Furthermore, the concentration distribution in a layer 42 can comprise a minimum particle concentration for the particles 30 for the absorption of electromagnetic radiation which corresponds to the concentration of the particles 30 in the second binder 28. A maximum particle concentration of the concentration distribution in the layer 42 can correspond to the concentration of the particles 30 in the first binder 26.

Furthermore, the device 10 comprises a very finely resolved distribution of the particles 30 for the absorption of electromagnetic radiation, which can comprise gradients in the particle concentration within a layer 42 and between various layers 42. The fine resolution of the particle distribution in the device 10 is effectuated by the production by means of the first binder 26 and the second binder 28 in combination with the powder material 34. The first and second binders 26 and 28 are applied in this case in pure form or as a mixture each in the form of small drops onto the powder material 34, so that in comparison to the prior art, very small regions of the powder material 34 are wetted by the binder 26, 28 or binder mixture 40, respectively. A predefined concentration distribution can thus be implemented very accurately in the device 10. A variation of the concentration within a layer 42 in various directions and between the layers 42 in a direction perpendicular to a layer 42 is also enabled.

The production of the material 36 of the device 10 can be performed by means of a 3D printer 12. The 3D printer 12 comprises in this case a first tank 14, in which the first binder 26 is stored. Furthermore, the 3D printer 12 comprises a second tank 16, in which the second binder 28 is stored. The two tanks 14, 16 are connected via lines 20, 22 to a printhead 18, wherein the lines 20, 22 supply the first binder 26 and the second binder 28 to the printhead 18. The printhead 18 comprises a mixing chamber 44, in which the first binder 26 and the second binder 28 can be mixed to form a binder mixture 40. The binder mixture 40 can also in this case consist solely of the first binder 26 or solely of the second binder 28, respectively.

Furthermore, the binder mixture 40 is deposited via an outlet nozzle 24 on a selected position 25 of a ply of powder material 34. The printhead 18 and the powder material 34 can in this case carry out a relative movement in a plane in which the powder material 34 is arranged. Furthermore, a relative movement can take place between the printhead 18 and the powder material 34 in a direction perpendicular to the plane when a layer 42 has been finished and a new ply of powder material 34 is to be deposited over the finished layer 42.

The powder material 34 can in this case be a plastic material, a metal alloy, or a ceramic material. In the example of the ceramic material, the device 10 can be subjected to very high temperatures, for example, at which plastics or metal alloys would be damaged.

Figure 1B:
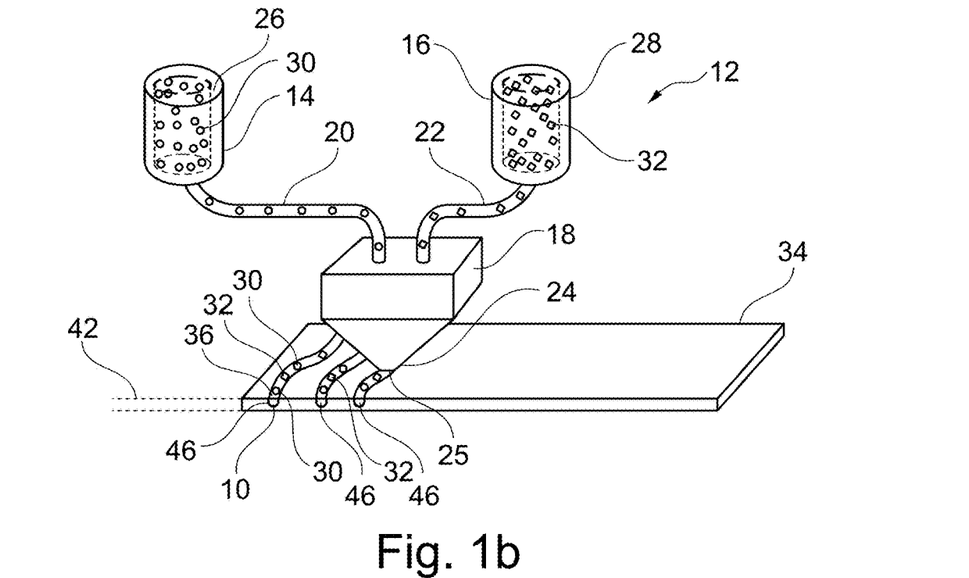

FIG. 1b shows an alternative or additional example of the device 10. The layer 42 of the device 10 comprises in this case multiple structural elements 46, which are produced separately from one another in the ply of the powder material 34 by the wetting using the binder mixture 40. The connecting of the individual structural elements 46 separate from one another in the layer 42 can be performed, for example, by the production of a further layer of the device 10 for the absorption of electromagnetic radiation above the structural elements 46, wherein structural elements are produced in the further layer which extend, for example, transversely in relation to the structural elements 46 of the already produced layer 42. A connection of the structural elements 46 can also already be performed with an underlying layer.

Furthermore, a second binder 28 is shown in FIG. 1b, which does not comprise particles 30 for the absorption of electromagnetic radiation. Instead, in the example of FIG. 1b, the second binder 28 comprises particles 32 which differ from the particles 30. However, this does not preclude examples in which the second binder 28 additionally comprises particles 30 for the absorption of electromagnetic radiation.

Figure 2A:
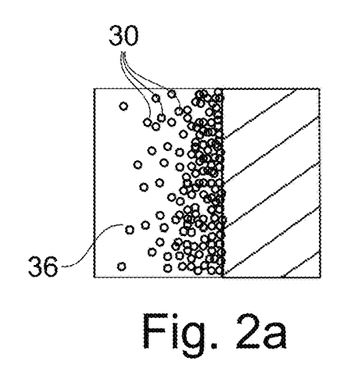
FIGS. 2a-c show schematic illustrations of possible structures of the produced device for the absorption of electromagnetic radiation in various scales.
Figure 2B:
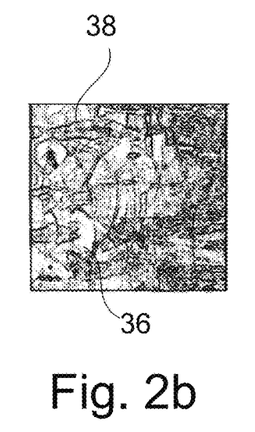
Figure 2C:
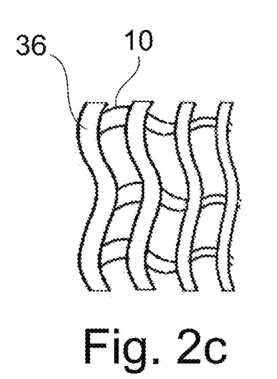

FIGS. 2a, 2b, and 2c show various scales of the produced material 36.

FIG. 2a shows the material 36 in a microscale in this case, in which the particles 30 for the absorption of electromagnetic radiation are shown. The particles 30 are embedded in this case in the particles of the powder material 34 bonded by the binder mixture 40. From left to right, the concentration of the particles 30 for the absorption of electromagnetic radiation increases in this case. No particles 30 are present on the left image side of FIG. 2a, i.e., the concentration of the particles 30 is zero here. The concentration of the particles 30 is maximum on the right side of FIG. 2a. A continuous transition of the particle concentration from zero to maximum particle concentration takes place in between.

A mesoscale of the material 36 is in FIG. 2b, at which the particles 30 for the absorption of electromagnetic radiation are no longer visible. Instead, the higher-order structure of the material 36 is shown on the microscopic level. This microscopic structure can be influenced by the selection of the binders 26, 28, the selection of the powder material 34, and the selection of the particles 30 and possibly of the particles 32. In this case, the microscopic structure of the material 36 can provide a contribution in the absorption of electromagnetic radiation. The material 36 can thus comprise crystalline structures 38 in the mesoscale, for example.

Furthermore, the microscopic structure can be varied within a layer 42 and between the layers 42. Thus, for example, pores can result in the microscopic structure of the material 36 by the suitable selection of the materials. These pores also have an influence on the absorption properties for electromagnetic radiation.

FIG. 2c shows a macroscale of the material 36, in which visible structural elements 46 of the device 10 are shown. Electromagnetic radiation can be influenced, for example, by absorption, diffraction, and/or interference effects by the arrangement of the structural elements 46, which represent a lattice structure in this example.

The structural elements 46 have a decreasing thickness and an increasing distance from one another from left to right in FIG. 2c. In this manner, a gradient can also be provided in the absorption properties for electromagnetic radiation by means of the structural elements 46.

Figure 3A:
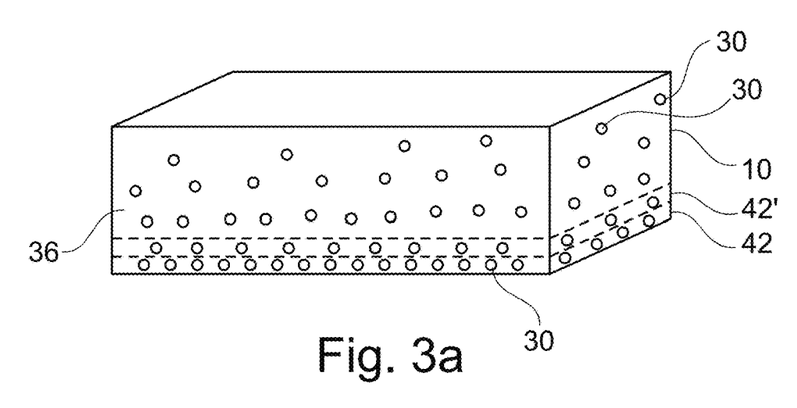
FIGS. 3a, b show schematic illustrations of devices for the absorption of electromagnetic radiation.

FIG. 3a shows a finished device 10, which can be arranged in one example on a substrate (not shown) and bonded thereto. The substrate can be a component in this case, for example, which is equipped with the device 10 to prevent a reflection of electromagnetic radiation which is incident on the component.

The device 10 comprises in this case a predefined concentration distribution for the particles 30 for the absorption of electromagnetic radiation in a layer 42. In a further layer 42', the device 10 comprises a different predefined concentration distribution for the particles 30 for the absorption of electromagnetic radiation. Electromagnetic radiation which propagates through the material 36 of the device 10 can be influenced differently at different positions in the device 10 due to the arrangement of the layers 42, 42' in relation to one another. If, for example, electromagnetic radiation is incident from above on the device 10 in FIG. 3a, for example, initially no influencing can take place until the electromagnetic radiation is within the device 10. In this case, the electromagnetic radiation can be influenced more and more strongly on the path through the device 10 from top to bottom, which is effectuated by the distribution of the particles 30 in the device 10.

In this manner, reflections due to a sudden transition from no influence of the electromagnetic radiation to a strong influence of the electromagnetic radiation can be avoided.

Figure 3B:
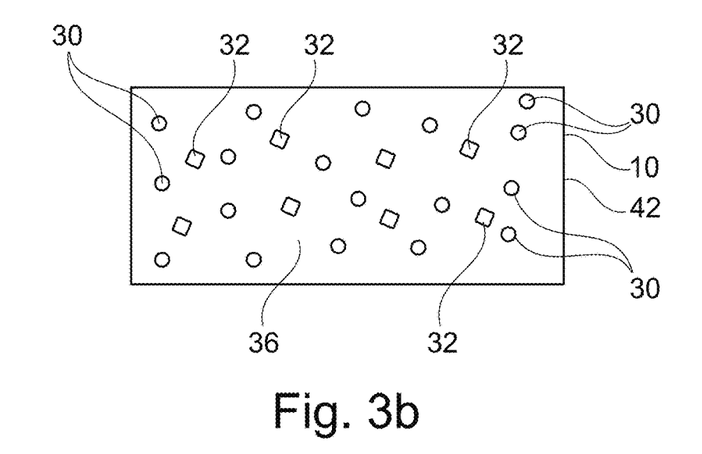

FIG. 3b shows a particle distribution in a layer 42 of a device 10. The layer 42 comprises in this case particles 30 for the absorption of electromagnetic radiation and particles 32 different from the particles 30. The particles 32 and the particles 30 mutually repel one another. During the production of the layer 42, a homogeneous distribution of the particles 30 in the binder mixture 40 was thus effectuated upon the mixing of the particles 32 with the particles 30 in the binder mixture 40. This homogeneous distribution of the particles 30 was transferred into the material 36 to be produced by the application of the binder mixture 40 to the powder material 34.

Figure 4A:
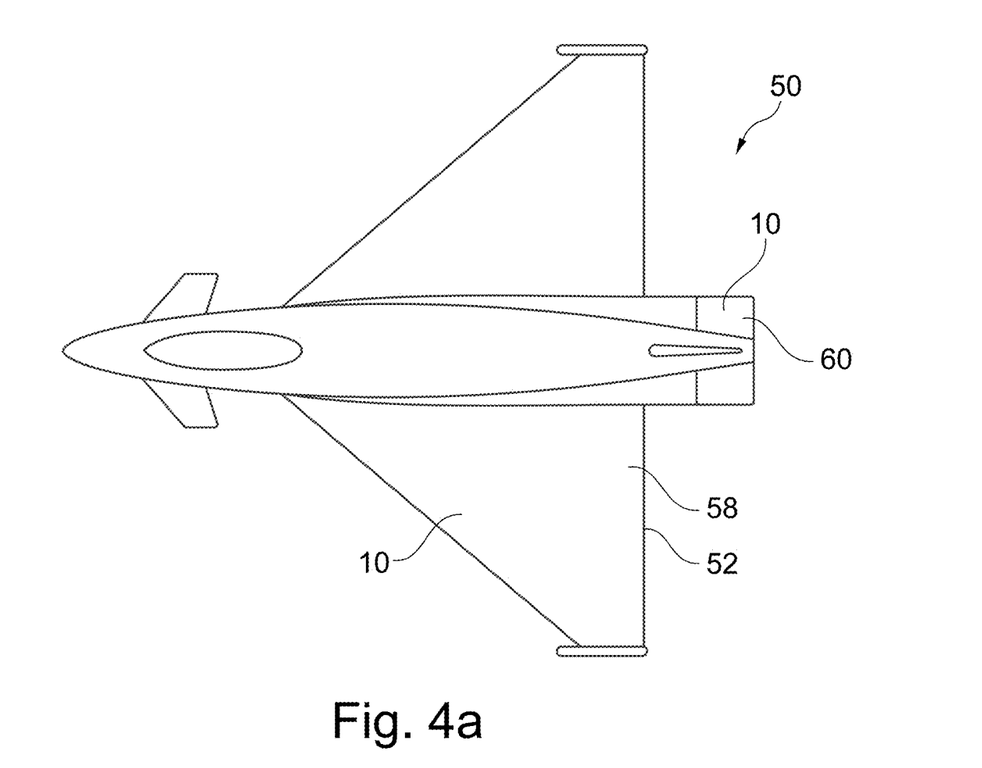
FIGS. 4a-c show schematic illustrations of means of transportation, which comprise the device for the absorption of electromagnetic radiation.
Figure 4B:
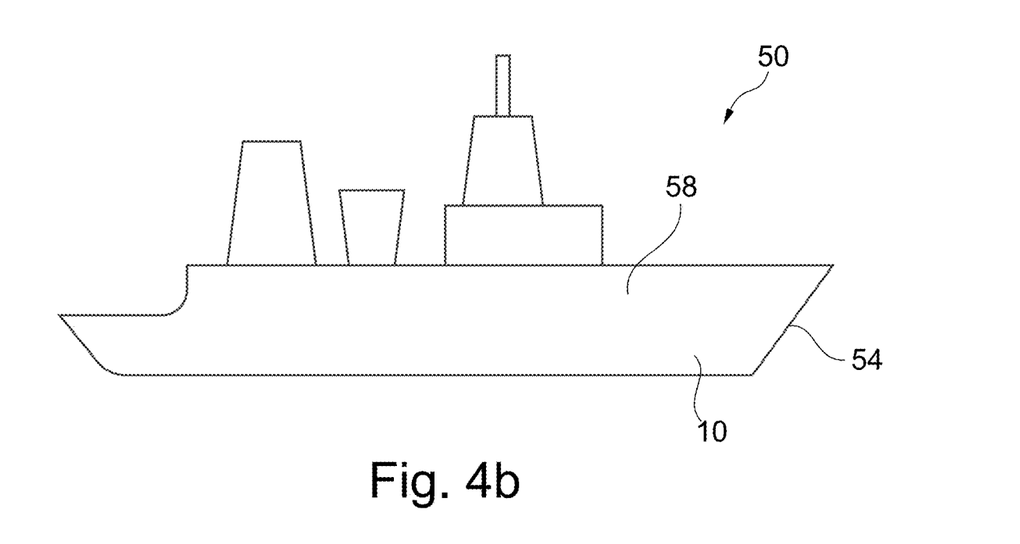
Figure 4C:
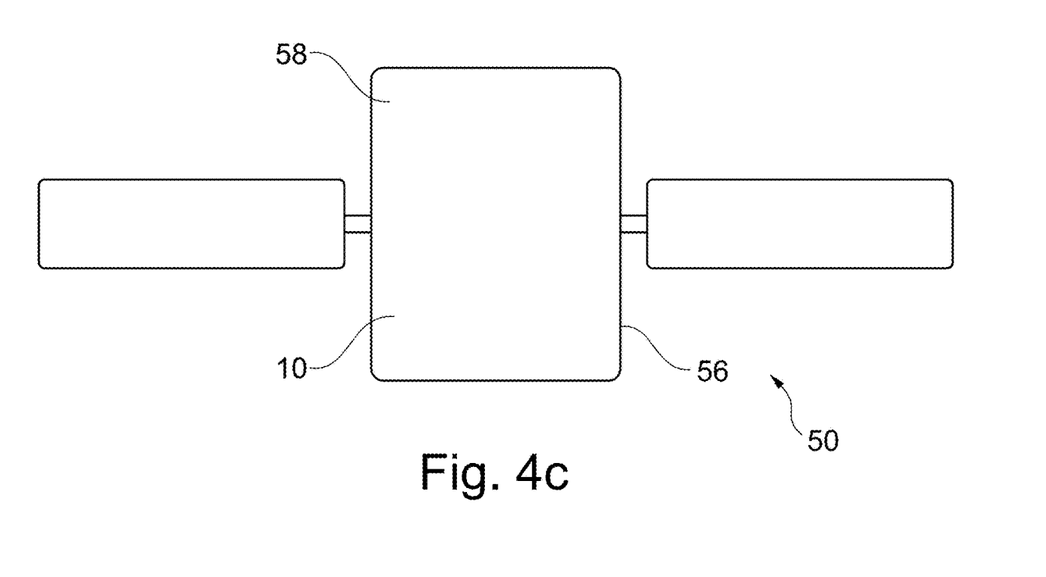

FIGS. 4a, 4b, and 4c show various means of transportation 50, which comprise a device 10 for the absorption of electromagnetic radiation.

FIG. 4a shows an aircraft 52 in this case, which comprises an outer skin 58. The outer skin 58 comprises in this case a device 10 for the absorption of electromagnetic radiation. The device 10 can be arranged in this case on the outer skin 48 and can be bonded to the outer skin 48. Alternatively or additionally, the device 10 can be integrated into the outer skin 48, i.e., the device 10 forms a part of the outer skin 48 over the entire outer skin 48.

Furthermore, the device 10 can be arranged, for example, on an engine outlet 60 if the device 10 comprises a material 34 which comprises a ceramic material which is not damaged at high temperatures.

FIG. 4b shows a ship 54. The ship 54 comprises an outer skin 58, which can be arranged on a side wall in FIG. 4b. The outer skin 58 comprises the device 10, wherein similar statements to the description of FIG. 4a apply.

This applies similarly to the means of transportation 50 of FIG. 4c, which shows a spacecraft 56, which comprises an outer skin 58, on which the device 10 is arranged.

Figure 5:
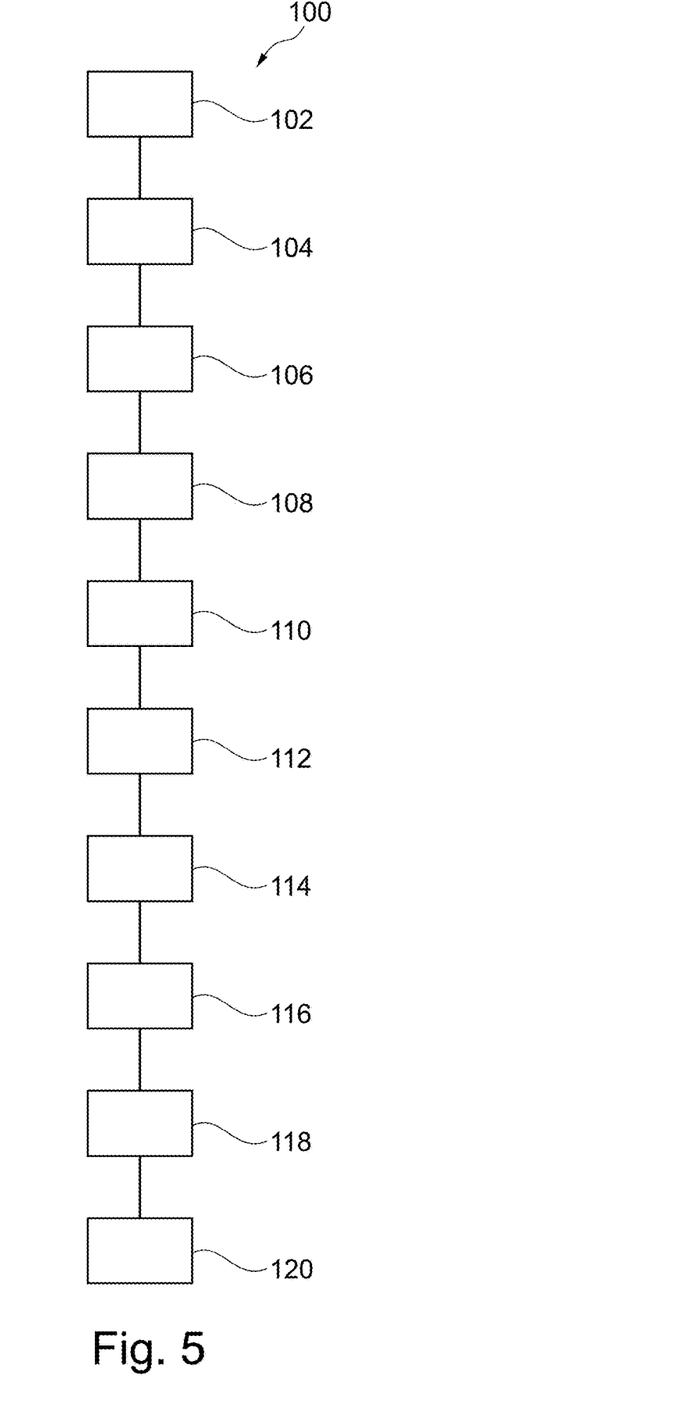
FIG. 5 shows a flow chart of an example of the method for producing a layer of a device for the absorption of electromagnetic radiation.

FIG. 5 shows a flow chart of the method 100 for producing a layer of a device for the absorption of electromagnetic radiation.

In a step 102, the method 100 provides a ply of powder material, which is arranged in the layer to be produced of the device for the absorption of electromagnetic radiation. The ply of powder material can comprise a structure pattern in the layer to be produced of the device for the absorption of electromagnetic radiation. The powder material can thus already establish a structure pattern for the layer to be produced of the device before the application of binder.

Furthermore, in a step 104, a predefined concentration distribution of particles for the absorption of electromagnetic radiation is provided in the layer of the device for the absorption of electromagnetic radiation. This concentration distribution is formed in this case so that, in combination with further layers to be produced of the device for the absorption of electromagnetic radiation, the electromagnetic radiation is absorbed optimally and a reflection of electromagnetic radiation on the device is avoided. The concentration distribution can comprise in this case gradients of the distribution of the particles for the absorption of electromagnetic radiation.

In a step 106, a first binder for the powder material and a second binder for the powder material are provided. In this case, the first binder comprises particles for the absorption of electromagnetic radiation. The second binder comprises a lower concentration of the particles for the absorption of electromagnetic radiation than the first binder. Furthermore, the second binder can alternatively or additionally comprise different particles from the particles for the absorption of electromagnetic radiation. The particles differing from the particles for the absorption of electromagnetic radiation can also be particles which absorb electromagnetic radiation. In this case, the particles and the particles differing therefrom can comprise dielectric, magnetic, and/or electrically conductive particles. Furthermore, the particles for the absorption of electromagnetic radiation and the particles differing therefrom can, alone or in combination with one another, absorb frequency ranges which are arranged in the megahertz, gigahertz, and/or terahertz range.

The steps 102, 104, and 106 can be carried out in any arbitrary sequence.

The method 100 comprises, in a step 108, the determination of a mixing ratio between the first binder and the second binder for each position in the layer on the basis of the predefined concentration distribution. The mixing ratio of the first and the second binder is based in this case on the number of the particles for absorbing the electromagnetic radiation which have to be provided in the mixed binder to effectuate an absorption of the electromagnetic radiation which corresponds to the predefined concentration distribution at the selected position. This is carried out for every position of the layer.

In a further step 110, a position of the layer is selected. To produce structural elements of the device, positions of the layer can be defined which are not selected and on which no binder mixture is therefore applied. Furthermore, the structure of the device can be defined on a macroscopic level with the selection of the positions of the layer.

For the selected position, according to a step 112, the first binder is mixed with the second binder according to the mixing ratio. The mixing ratio can also provide in this case that the first binder or the second binder is to be provided in pure form.

The mixed binder is applied in a step 114 to the powder material at the selected position, so that the mixed binder wets the powder material at this position. Bonding of the particles of the powder material to one another is thus effectuated at the selected position. At the same time, in this case particles for the absorption of electromagnetic radiation are introduced into the powder material according to the concentration distribution.

The steps 110,112, and 114 are repeated according to a further step 116 until a layer of the device for the absorption of electromagnetic radiation has been produced.

In a further step 118, the above-mentioned method steps 102 to 116 can be repeated for the production of multiple layers of the device for the absorption of electromagnetic radiation. In this case, after the finishing of a layer of the device according to step 102, a further ply of powder material is deposited on the produced layer and the sequence continues with the further steps 104 to 116. It is also possible to begin with the steps 104, 106, and 108 simultaneously with step 102.

If the powder material comprises a ceramic material, in a further step 120 after production of all layers, the device for the absorption of electromagnetic radiation can be sintered to finish the device for the absorption of electromagnetic radiation and cure the ceramic material.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method for producing a layer of a device for the absorption of electromagnetic radiation, wherein the method comprises:
   providing a ply of powder material in the layer to be produced of the device for the absorption of electromagnetic radiation;
   providing a predefined concentration distribution of particles for the absorption of electromagnetic radiation in the layer of the device for the absorption of electromagnetic radiation;
   providing a first binder for the powder material and a separate second binder for the powder material, wherein the first binder comprises particles mixed in the first binder for the absorption of electromagnetic radiation, wherein the second binder comprises identical or different particles in a lower concentration mixed in the second binder for the absorption of electromagnetic radiation than the first binder or the second binder comprises no particles at all;
   determining a mixing ratio between the first binder and the second binder for every position in the layer on the basis of the predefined concentration distribution;
   selecting a position of the layer;
   mixing the first and second binder according to the mixing ratio for the selected position;
   wetting the powder material at the selected position using the mixed first and second binder; and repeating the steps of selecting, mixing, and wetting to produce a layer of the device for the absorption of electromagnetic radiation.

2. The method according to claim 1, wherein the particles for the absorption of electromagnetic radiation comprise dielectric, magnetic, and/or electrically conductive particles.

3. The method according to claim 1, wherein the particles, alone or in combination with one another, are configured to absorb the electromagnetic radiation in megahertz, gigahertz, and/or terahertz range.

4. The method according to claim 1, wherein the powder material is homogeneous.

5. The method according to claim 1, wherein the powder material is a mixture of at least two different powder materials.

6. The method according to claim 1, wherein the powder material comprises a ceramic material.

7. The method according to claim 1, wherein the method further comprises:

repeating the method steps after producing a layer to produce at least one further layer of the device for the absorption of electromagnetic radiation on the produced layer.

8. The method according to claim 1, wherein the selected positions of the layer form a structure pattern which comprises pores.

9. The method according to claim 6, wherein the method further comprises, after the production of all layers of the device for the absorption of electromagnetic radiation:
sintering the device for the absorption of electromagnetic radiation.

10. The method according to claim 1, wherein the selected positions of the layer form a structure pattern having different density distributions of the powder material in combination with at least the first binder.

11. The method according to claim 1, wherein the ply of powder material in the layer to be produced of the device for the absorption of electromagnetic radiation has a structure pattern.

* * * * *